(12) United States Patent
Nistler et al.

(10) Patent No.: US 7,145,335 B2
(45) Date of Patent: Dec. 5, 2006

(54) MAGNETIC RESONANCE APPARATUS HAVING A HOLLOW INTERIOR WITH A GRADIENT COIL DISPOSED THEREIN

(75) Inventors: Jürgen Nistler, Erlangen (DE); Stefan Stocker, Grossenseebach (DE); Markus Vester, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 72 days.

(21) Appl. No.: 10/910,893

(22) Filed: Aug. 4, 2004

(65) Prior Publication Data
US 2005/0030031 A1 Feb. 10, 2005

(30) Foreign Application Priority Data
Aug. 5, 2003 (DE) ................. 103 35 789

(51) Int. Cl.
*G01V 3/00* (2006.01)
(52) U.S. Cl. ..................................... 324/307
(58) Field of Classification Search ............... None
See application file for complete search history.

(56) References Cited

U.S. PATENT DOCUMENTS

| 4,785,246 A | 11/1988 | Sugimoto |
| 4,864,241 A | 9/1989 | Goldie |
| 5,467,017 A * | 11/1995 | Duerr et al. ................. 324/318 |
| 5,574,372 A | 11/1996 | Moritz et al. |
| 5,585,724 A * | 12/1996 | Morich et al. .............. 324/318 |
| 5,952,830 A * | 9/1999 | Petropoulos et al. ....... 324/318 |
| 6,531,870 B1 | 3/2003 | Heid et al. |

* cited by examiner

*Primary Examiner*—Diego Gutierrez
*Assistant Examiner*—Dixomara Vargas
(74) *Attorney, Agent, or Firm*—Schiff Hardin LLP

(57) ABSTRACT

A magnetic resonance apparatus with a hollow interior and with a gradient coil system disposed in the hollow interior, wherein the hollow interior exhibits a barrel-like bulge, the gradient coil system is essentially enclosed by a radio-frequency shield, and he radio-frequency shield is fashioned free of a slotting in regions in which it, with regard to a boundary of the hollow interior is at a shorter distance compared with a middle region of the bulge.

9 Claims, 2 Drawing Sheets

MAGNETIC RESONANCE APPARATUS HAVING A HOLLOW INTERIOR WITH A GRADIENT COIL DISPOSED THEREIN

BACKGROUND OF THE INVENTION

1. Field of the Invention

The present invention concerns a magnetic resonance apparatus with a hollow interior and a gradient coil system disposed in the hollow interior.

2. Description of the Prior Art

Magnetic resonance is a known technology to acquire images of the inside of a body of an examination subject. In a magnetic resonance device, rapidly switched gradient fields that are generated by a gradient coil system are superimposed on a static homogenous basic magnetic field that is generated by a basic field magnet. The magnetic resonance device also has a radio-frequency system that radiates radio-frequency energy into the examination subject to excite magnetic resonance signals, and that acquires the generated magnetic resonance signals, on the basis of which magnetic resonance images are produced.

A magnetic resonance apparatus is known from German OS 44 14 371 in which a radio-frequency shield is disposed between a radio-frequency antenna and a gradient coil system, this radio-frequency shield being fashioned to be permeable for the electromagnetic fields generated in the low-frequency range by the gradient coil system and impermeable for the fields generated in the radio-frequency range by the radio-frequency antenna. The radio-frequency shield has a first electrically-conductive layer arrangement and (additionally) a second electrically-conductive layer arrangement disposed opposite the first, these electrically-conductive layer arrangements being separated from one another by a dielectric. Each layer arrangement has adjacent conductor runs that are separated from one another by electrically insulated slots; the slots in the first layer arrangement being displaced offset relative to those in the second layer arrangement. In at least one layer the adjacent conductor runs are connected with one another via specially arranged bridges (including, for example, capacitors) that conduct substantially only high-frequency currents.

A magnetic resonance apparatus with a gradient coil system is known from German OS 101 56 770 in which an electrically-conductive structure is arranged and fashioned such that, at least within in imaging volume of the magnetic resonance apparatus, a 3D field pattern of a magnetic field produced by a gradient field via induction effects is geometrically similar to the 3D field pattern of the gradient field. In an embodiment, at least one part of the structure is barrel-stored as a component of a basic field magnet. Among other things, this gradient coil system can be advantageously fashioned without gradient shielding coils, because the unwanted consequences of the switched gradient fields can be nearly completely controlled by a pre-distortion due to the geometric similarity of the magnetic field caused by the structure, such that no diminution of the gradient fields occurs due to the gradient shielding coils.

SUMMARY OF THE INVENTION

An object of the present invention is to provide a magnetic resonance apparatus with a radio-frequency low-loss radio-frequency shield.

This object is achieved in accordance with the invention by a magnetic resonance apparatus with a hollow interior and a gradient coil system disposed in the hollow interior wherein the hollow interior exhibits a barrel-like bulge, and wherein the gradient coil system is essentially enclosed by a radio-frequency shield, and wherein the radio-frequency shield is free of slots (openings) in regions in which it, with regard to a boundary of the hollow interior, is at a shorter distance compared to a middle region of the bulge.

The invention is based on the recognition that, in a magnetic resonance apparatus with an electrically-conductive structure corresponding to the aforementioned German OS 101 56 770 which basically requires a comparably large wall thickness of the structure, magnetic fields substantially free of a component perpendicular thereto is achieved in direct proximity to a surface of the structure, such that regions of a radio-frequency shield that are arranged in spatial proximity to this surface require no suppression measures with regard to magnetic field-inducing eddy currents, and thus can be fashioned free of slots. Stray currents associated with the radio-frequency field thus are prevented in the specified regions of the radio-frequency shield, such that radio-frequency losses are advantageously reduced.

DESCRIPTION OF THE PREFERRED EMBODIMENTS

Figure 1:
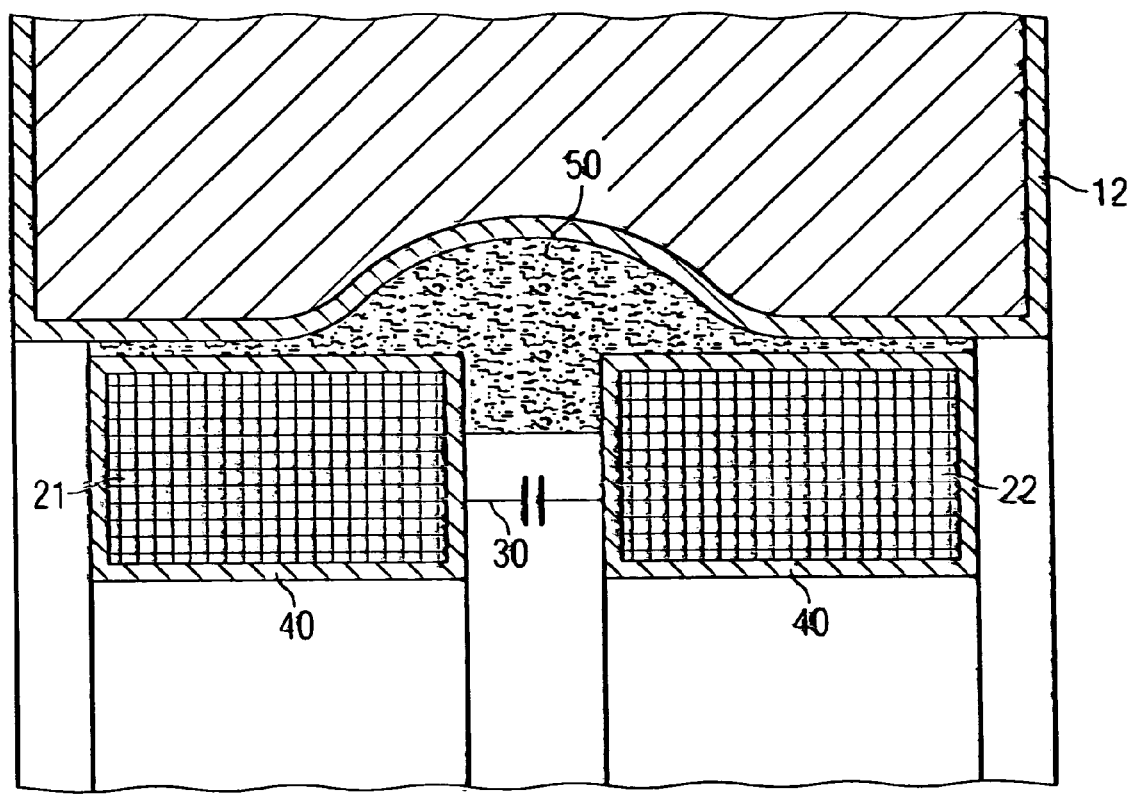
FIG. 1 is a longitudinal section through an upper half of a magnetic resonance apparatus in accordance with the invention, with a tunnel-like patient acceptance chamber, a basic field magnet with a hollow interior exhibiting a barrel shaped bulge, and a gradient coil system formed by two units and surrounded by a radio-frequency shield.

As an exemplary embodiment of the invention, FIG. 1 shows a longitudinal section through an upper half of an magnetic resonance apparatus with a tunnel-like patient acceptance chamber. To generate an optimally homogenous static basic magnetic field in the patient acceptance chamber, the magnetic resonance apparatus has an essentially hollow-cylindrical superconducting basic field magnet, with an electrically-conductive vacuum reservoir 12 of the basic field magnet that exhibits a barrel-like bulge In the region of the hollow interior to implement the concept of the aforementioned German OS 101 56 770. A time-varying magnetic fields generator having a non-actively shielded gradient coil system and a radio-frequency antenna is disposed in the hollow interior of the basic field magnet. The generator is connected with the basic field magnet, by an intervening space between both elements filled with a mass 50 that exhibits low dielectric radio-frequency losses, and that reinforces the overall arrangement to reduce mechanical vibrations and oscillations, so that a creation of noise is counteracted during operation of the magnetic resonance apparatus.

The gradient coil system is formed by two hollow-cylindrical units 21 and 22 separated from one another that contain a first and second transversal gradient coils as well as a longitudinal gradient coil to generate rapidly-switchable gradient fields. Each of the two units 21 and 22 is essentially enveloped by a radio-frequency shield 40. Between the radio-frequency shield 40 of both units 21 and 22 are parts 30 of the radio-frequency antenna that, for example, can be antenna rods and resonance capacitors to form a low-pass birdcage radio-frequency antenna. One part of the radio-frequency shield 40 also forms a portion of the current paths of the radio-frequency antenna, to which the aforementioned parts 30 of the radio-frequency antenna are connected for conduction at radio frequencies with the radio-frequency shield 40.

Figure 2:
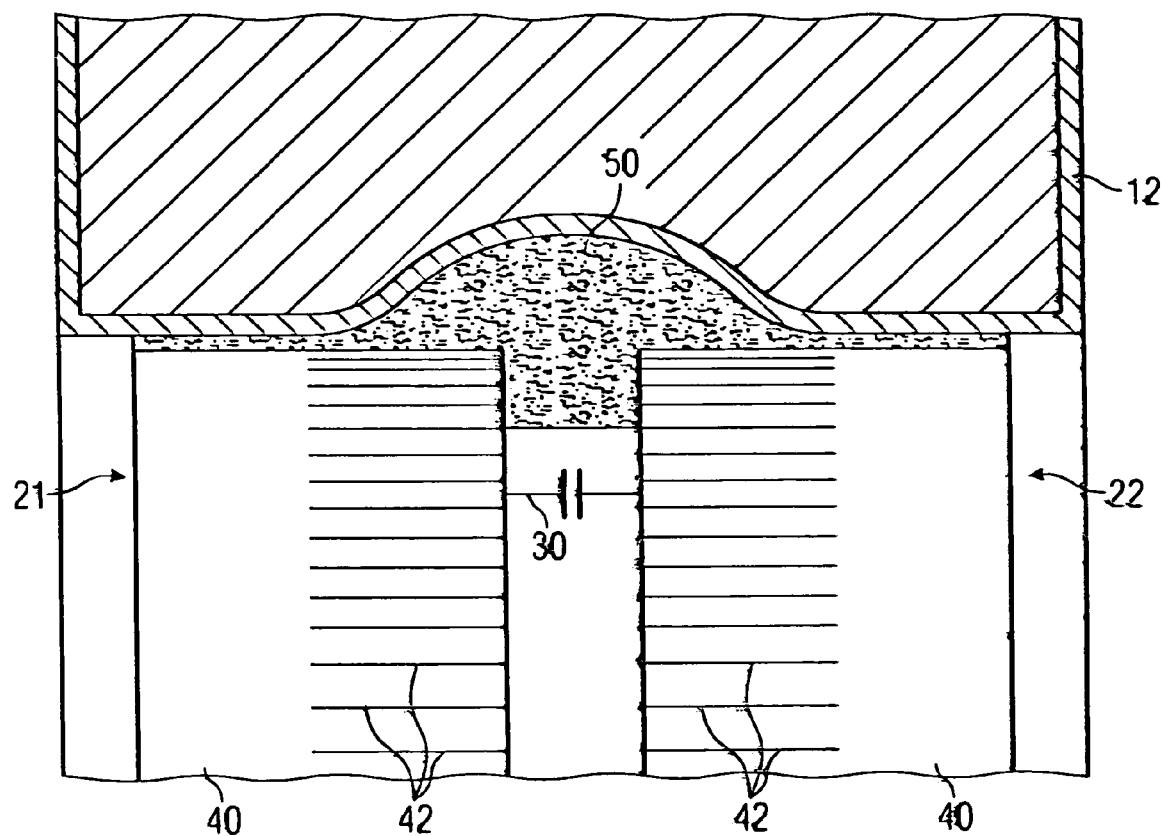
FIG. 2 is the longitudinal section of FIG. 1 with the gradient coil system and the radio-frequency shield not sectioned.

The radio-frequency shield 40 is fashioned free of slots in a region in which it is at a shorter distance (compared with a middle region of the bulge) with regard to the vacuum reservoir 12, whereas slots 42 are provided in a known manner in the remaining region. This is shown in FIG. 2, which, compared to FIG. 1 differs only in that the gradient coil system and the radio-frequency shield 40 are not shown in section, thus the exterior surface of the radio-frequency shield 40 is seen.

Among other things, reference is made to the subsequently published German OS 103 13 229 of the assignee for a detailed specification of the advantages of a gradient coil system formed by two units 21 and 22 with a radio-frequency shield disposed between them relative to conventional solutions and the distribution of conductors of the gradient coils in both of the units 21 and 22.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance apparatus comprising:
   a basic field magnet having a longitudinally extending hollow interior bore having an interior surface with a barrel-shaped bulge therein, said bulge having a middle region;
   a gradient coil system disposed in said hollow interior bore; and
   a radio frequency shield substantially enclosing said gradient coil system, said radio-frequency shield having a plurality of slots therein and being free of slots in a region of said radio frequency shield disposed at a shorter distance from said interior surface with respect to a distance to said interior surface at said middle region of said bulge.

2. A magnetic resonance apparatus as claimed in claim 1 wherein said gradient coil system is comprised of two units that are structurally separated from each other in said hollow interior bore.

3. A magnetic resonance apparatus as claimed in claim 2 wherein said units are separated from each other at said middle region of said bulge.

4. A magnetic resonance apparatus as claimed in claim 2 wherein each of said units is independently substantially enclosed by said radio- frequency shield.

5. A magnetic resonance apparatus as claimed in claim 3 comprising a radio-frequency antenna having a portion thereof disposed between said units.

6. A magnetic resonance apparatus as claimed in claim 2 wherein each of said units is a hollow cylinder.

7. A magnetic resonance apparatus as claimed in claim 1 wherein said gradient coil system is a hollow cylinder.

8. A magnetic resonance apparatus as claimed in claim 1 wherein said interior surface of said basic field magnet is generally cylindrical at opposite sides of said bulge along said hollow interior bore.

9. A magnetic resonance apparatus as claimed in claim 1 wherein said basic field magnet is a superconducting basic field magnet having a vacuum vessel, and wherein a wall of said vacuum vessel forms said interior surface having said barrel-shaped bulge.

\* \* \* \* \*